(12) United States Patent
Cole et al.

(10) Patent No.: US 7,276,942 B2
(45) Date of Patent: Oct. 2, 2007

(54) METHOD FOR CONFIGURABLY ENABLING PULSE CLOCK GENERATION FOR MULTIPLE SIGNALING MODES

(75) Inventors: Ying Cole, Portland, OR (US); Songmin Kim, Beaverton, OR (US); Robert Greiner, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/359,016

(22) Filed: Feb. 21, 2006

(65) Prior Publication Data

US 2006/0139068 A1 Jun. 29, 2006

Related U.S. Application Data

(62) Division of application No. 10/750,558, filed on Dec. 31, 2003, now Pat. No. 7,038,505.

(51) Int. Cl.
*H03L 7/00* (2006.01)

(52) U.S. Cl. ............... 327/144; 327/145; 327/291; 327/295

(58) Field of Classification Search ............... None
See application file for complete search history.

(56) References Cited

U.S. PATENT DOCUMENTS

| 4,897,635 | A | * | 1/1990 | Topping ............... 340/681 |
| 5,598,113 | A | * | 1/1997 | Jex et al. ............... 326/94 |
| 6,055,587 | A | | 4/2000 | Asami et al. |
| 6,591,319 | B2 | | 7/2003 | Kurd et al. |
| 2001/0009435 | A1 | | 7/2001 | Nagumo |
| 2004/0143773 | A1 | | 7/2004 | Chen |

* cited by examiner

*Primary Examiner*—Tuan T Lam
(74) *Attorney, Agent, or Firm*—Schwabe, Williamson & Wyatt, P.C.

(57) ABSTRACT

A method and a system for configurably generating enabling pulse clocks are disclosed herein. In various embodiments, enabling pulse clocks are configurably generated for a selected one of a first and a second signaling mode, employing a configurable enabling pulse clock generator configurable to so generate the enabling pulse clocks.

10 Claims, 11 Drawing Sheets

14 and 16

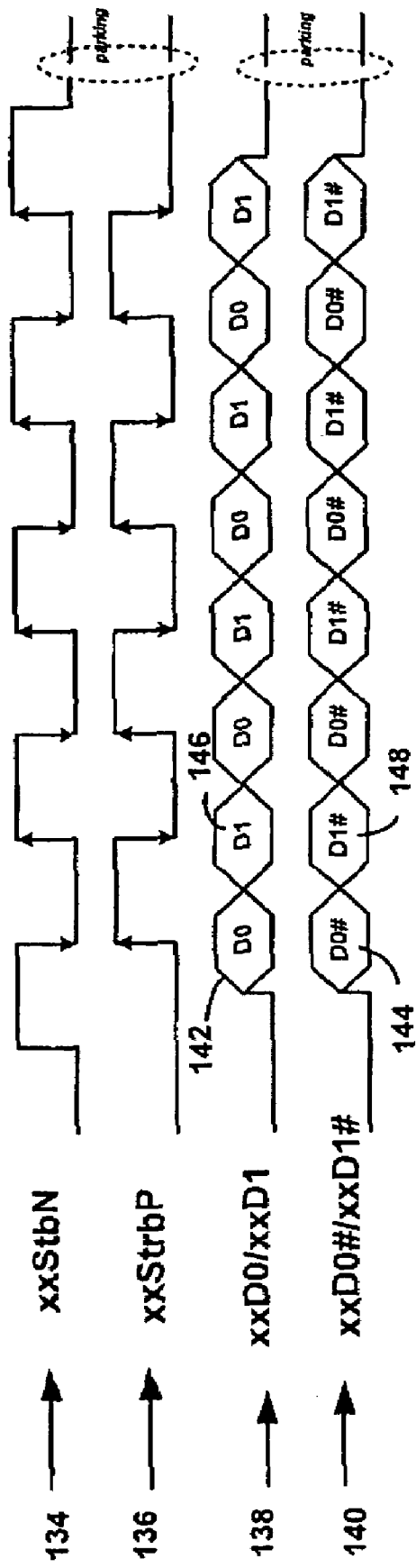

250

800

METHOD FOR CONFIGURABLY ENABLING PULSE CLOCK GENERATION FOR MULTIPLE SIGNALING MODES

RELATED APPLICATION

This application is a divisional of U.S. application No. 10/750,558 filed Dec. 31, 2003 titled "Configurable Enabling Pulse Clock Generation for Multiple Signaling Modes," now issued as U.S. Pat. No. 7,038,505.

FIELD OF THE INVENTION

The present invention is related to the field of integrated circuits, and, more particularly, to input sections of integrated circuits.

BACKGROUND OF INVENTION

In the current state of integrated circuit technology, there are at least two types of data input signaling modes, single-ended signaling mode and differential signaling mode. Currently, for a variety of reasons, the former tends to be favored by the lower speed, higher voltage integrated circuits, while the later tends to be favored by the higher speed, lower voltage integrated circuits. The differences between the two signaling modes create difficulties for designing the Input sections of the integrated circuits of the different types, especially since they often have to co-exist and co-operate with each other in the same system.

BRIEF DESCRIPTION OF DRAWINGS

Embodiments of the present invention will be described referencing the accompanying drawings in which like references denote similar elements, and in which:

FIG. 2C illustrates a timing diagram for differential signaling.

DETAILED DESCRIPTIONS OF EMBODIMENTS OF THE INVENTION

Embodiments of the present invention include but are not limited to a micro-architecture for an input section of an integrated circuit (IC), such as CPU and/or Chipset, that may be configured to support either differential or single-ended signaling mode of source synchronous data transfer/signaling, IC having such input sections, and systems having such ICs.

In the following detailed description, various aspects of the embodiments of the invention will be described. However, it will be apparent to those skilled in the art that other embodiments may be practiced with only some or all of these aspects. For purposes of explanation, specific numbers, materials and configurations are set forth in order to provide a thorough understanding of these embodiments. However, it will also be apparent to one skilled in the art that other embodiments may be practiced without the specific details. In other instances, well-known features are omitted or simplified in order not to obscure the description.

Figure 1:
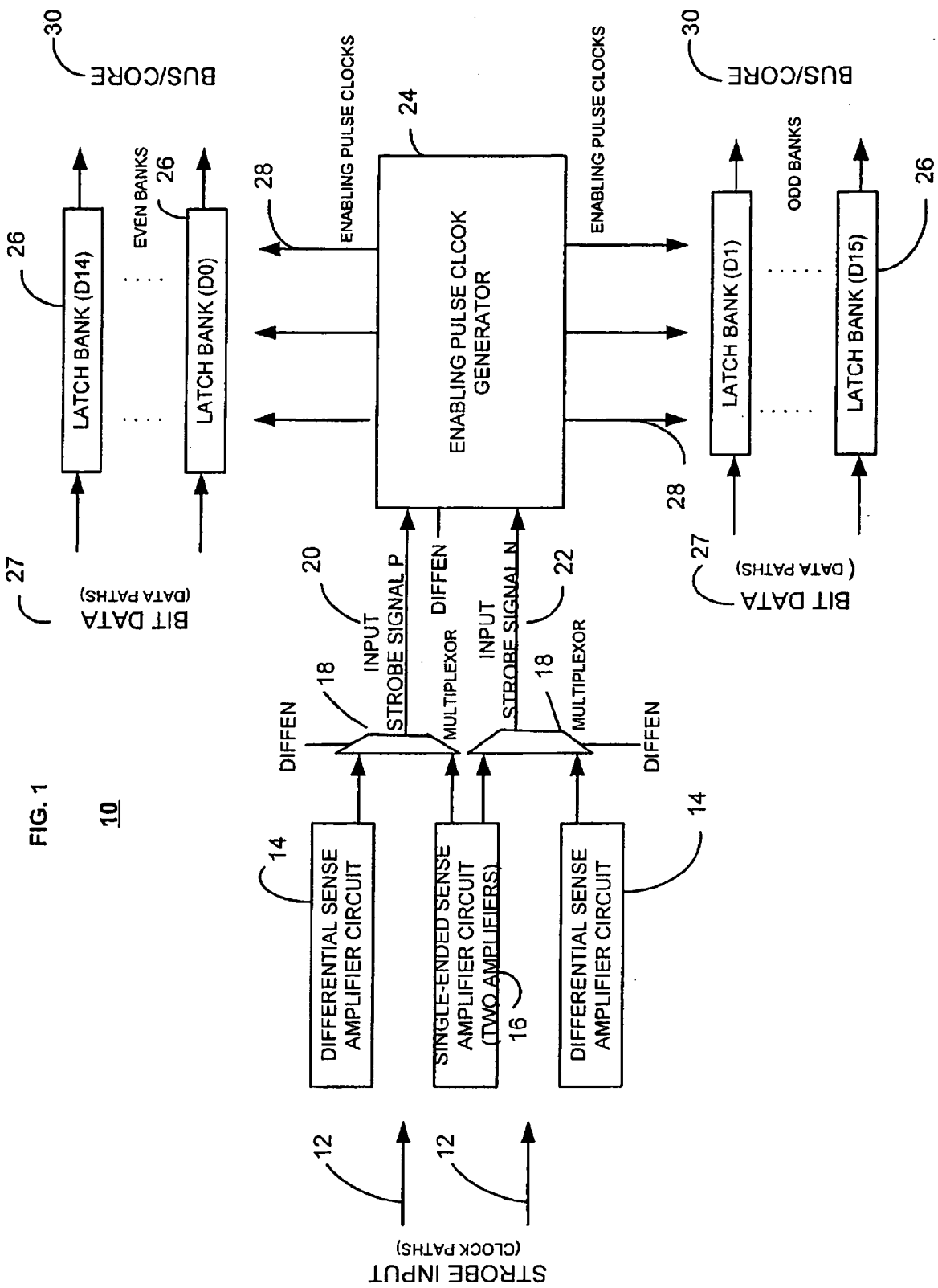
FIG. 1 is a block diagram of an input section of an integrated circuit, including a configurable enabling pulse clock generator, according to some embodiments of the invention.

FIG. 1 is a block diagram of an input section 10 of an integrated circuit (IC), according to some embodiments of the present invention. As illustrated, input section 10 includes a number of latch banks 26, enabling pulse clock generator 24, multiplexors 18, and sense amplifier circuits 14 and 16 coupled to each other as shown.

Latch banks 26 may be employed to latch and temporarily store the data being transferred to the IC. The latch banks 26 may operate in accordance with enabling pulse clocks 28. The latch banks 26 may, for example, be employed to latch bit data off input data paths 27, hold them temporarily, and then transfer them onto a data bus 30. For ease of understanding, the embodiment is illustrated with 16 latch banks, organized as two groups of 8. The two groups are referred to as even banks and odd banks. Other embodiments may have more or less latch banks, as well as having the latch banks organized in other manners.

An enabling pulse clock generator 24 may be employed to provide latch banks 26 with enabling pulse clocks 28 to control their operations. The enabling pulse clock generator 24 may provide enabling pulse clocks 28 in accordance with at least strobe signals P and N 20 and 22. As will be described in more detail below, enabling pulse clock generator 24 may be designed to be configurable (e.g. per control signal Diffen) to provide enabling pulse clocks 28 further in accordance with a selected one of at least the single-ended signaling mode and the differential signaling mode.

Resultantly, input section 10 including latch banks 26 may be configurable for use for an input section of an IC to facilitate data transfer via single-ended signaling, or another input section of another IC to facilitate data transfer via differential signaling. Additionally, input section 10 may also be used in an IC to enable the IC to be configurable to support either single-ended or differential signaling.

Sense amplifier circuits 14 and 16 (two each) are employed to provide strobe signals P and N 20 and 22 to enabling pulse clock generator 24 for the differential signaling mode and the single-ended signaling mode respectively. Both sense amplifier circuits 14 and 16 provide strobe signals P and N 20 and 22 in accordance with at least strobe inputs 12.

In various embodiments, strobe inputs 12 are provided by the source of the data being transferred, to facilitate alignment with the centers of the data being transferred (see e.g. FIG. 2c). In other words, the data may be transferred source synchronously. Strobe inputs 12 may be provided in parallel with the data (requiring no extraction) or interleaved with the data (requiring extraction).

Multiplexors 18 are employed to configurably select and provide (e.g. per control signal Diffen) the outputs of sense amplifier circuits 14 and 16 as strobe signals P and N 20 and 22 for the differential signaling mode and the single-ended signaling mode respectively.

Configuration of input section 10 may be effectuated in any one of a number of manners, including but are not limited to the setting of one or more control bits in a configuration register (not shown) of the IC, or fusing of one or more fuses (not shown) of the IC. In various embodiments, the configuration register or the fuses may be configured to cause the control signal Diffen to assume a value of "1" to configure input section 10 to operate in a differential signaling mode, and a value of "0" to configure input section 10 to operate in a single-ended signaling mode.

Figure 2A:
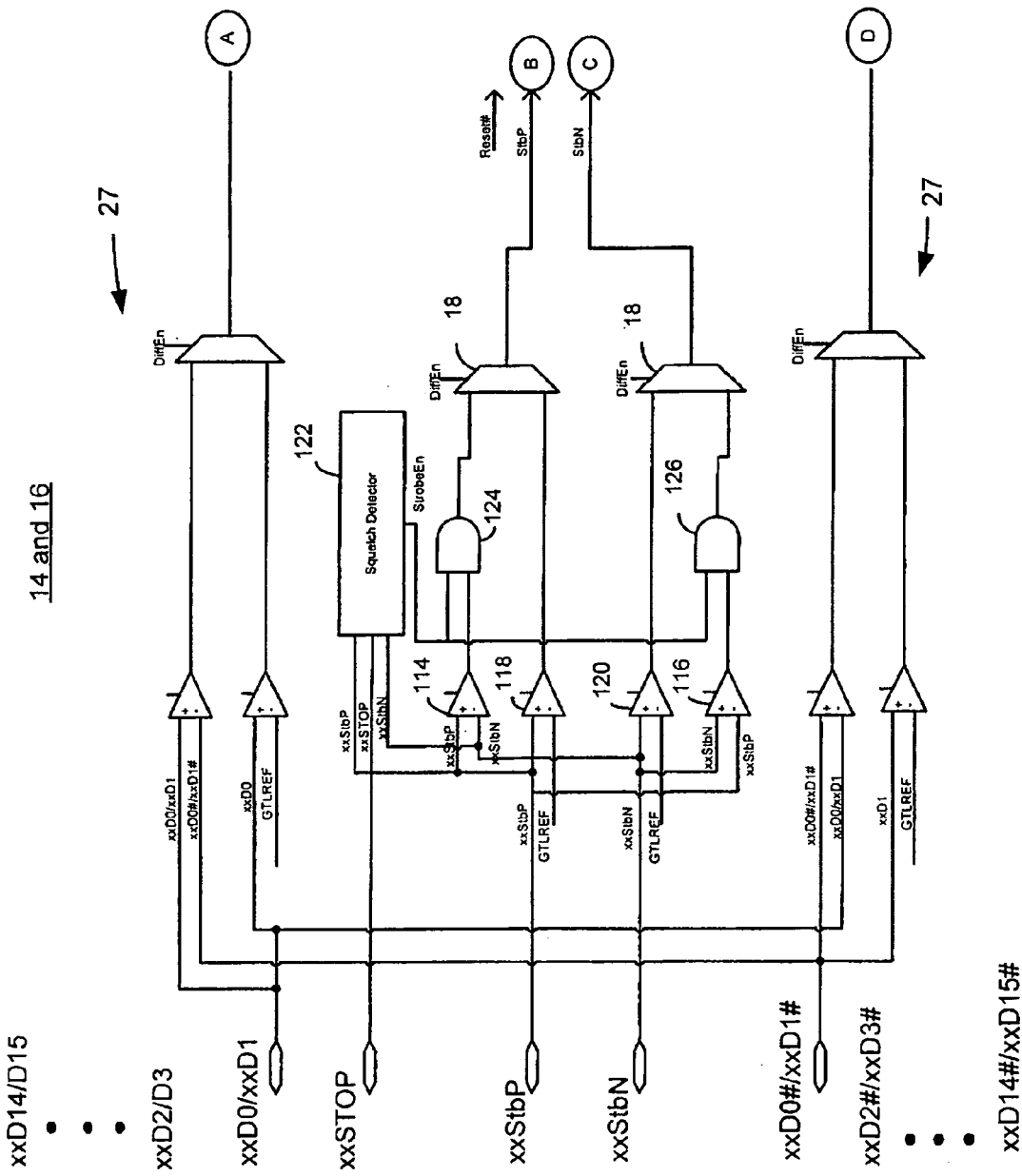
FIGS. 2A and 2B illustrate the input section of FIG. 1 in further detail, in particular, the sense amplifier circuits and the latch banks, according to some embodiments of the invention.
Figure 2B:
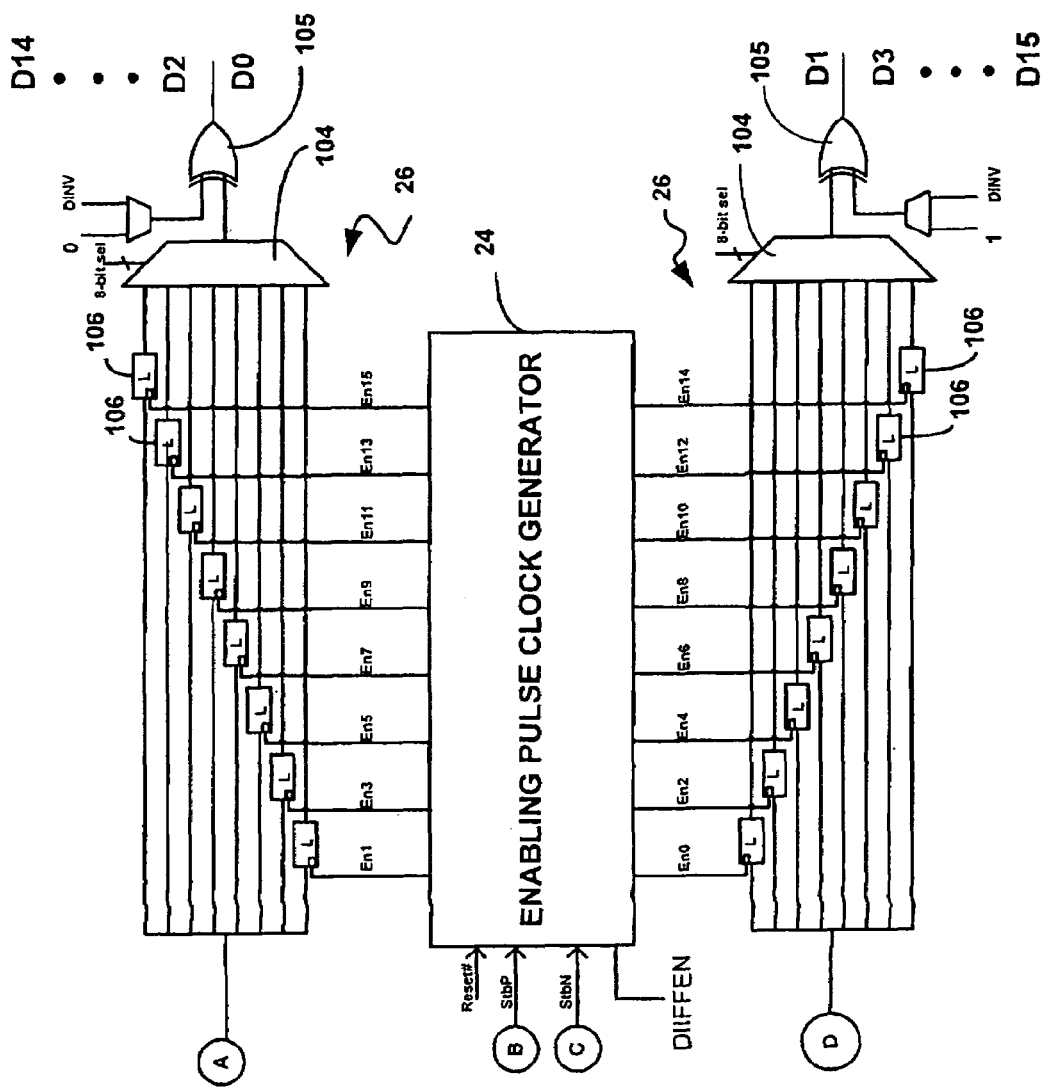

FIGS. 2A and 2B illustrate input section 10 in further detail, in particular sense amplifier circuits 14 and 16 and latch banks 26, according to some embodiments of the invention. As described earlier, 16 latch banks 26 are illustrated for the embodiments, the latch banks 26 divided into two groups of even and odd latch banks, 104 and 105. Further, as illustrated in FIG. 2B, for the embodiment, each of latch banks 26 contains 8 deskewing latches 106 for capturing bit data received via data paths 27. As described earlier (re latch banks 26) deskewing latches 106 latch data off data paths 27 in accordance with enabling pulse clocks 26, more specifically, enabling pulse clocks En0-En15. In various embodiments, a set of enabling pulse clocks En0-En15 is provided in a predetermined time period, e.g. two bus clock cycles. Moreover, enabling pulse clocks En0-En15 may be configurably provided in one of at least two manners, a manner suitable for differential signaling and another manner suitable for single-ended signaling. In the former case, enabling pulse clocks En0-En15 may be provided in 16 points in time during the period, one enabling pulse clock per point in time, whereas in the later case, enabling pulse clocks En0-En15 may be provided in 8 points in time during the period, two enabling pulse clock per point in time, to be described more fully below.

For the embodiment, once latched, the data are stored in each of the deskewing latches 106 for at least one bus clock cycle. The stored data may be subsequently transferred in turn onto bus 30 using selectors 104. Further, for the embodiment, bit inversion circuitry 105 may also be provided for each latch bank 26 to reduce switching noise.

As illustrated in FIG. 2A, for the embodiment, data are provided to the 16 latch banks 26 via 16 corresponding data paths 27. The 16 data paths 27 are employed to provide data for single-ended signaling as well as differential signaling. In the former case, each data path provides 1 bit of data, xxD0, xxD1, and so forth. In the latter case, in general, two adjacent data paths are employed to provide 1 bit of data (xxDi and xxDi#). However, to achieve at least the same data transfer rate for a given set of pins (16 for the embodiment), the embodiment is designed to allow data to be transmitted on each data path at twice the speed while operating in the differential signaling mode (as compared to the speed of transmission while operating in the single-ended mode). Thus, two streams of data bits may be multiplexed on each pair of data paths, xxD0/xxD1, xxD0#/xxD1#, xxD2/xxD3, xxD2#/xxD3#, and so forth.

As also illustrated in FIG. 2A, for the embodiment, each of sense amplifier circuits 16 includes sense amplifier 118 and 120, whereas each of sense amplifier circuits 14 includes sense amplifier 114 and 116. In the former case, each of sense amplifiers 118/120 receives one of the two strobe signals, and a Gunning Transceiver Logic ("GTL") signal (GTLREF) as a reference signal, and generates StbP/StbN based on the received signals. In the latter case, each of sense amplifiers 114 and 116 receives both two strobe signals, and generates StbP/StbN based on the received signals (in opposite manners).

For the embodiment, a squelching arrangement comprising squelch detector 122 and AND gates 124 and 126 may also be provided to ensure correct output of the StbP and StbN signals. More specifically, the squelching arrangement may be employed to squelch random noises, when the strobe signals are "parked", and prevent the random noises from being outputted as StbP and StbN. Further, for the embodiment, squelch detector 122 may be provided with a STOP signal denoting for squelch detector 122 a last valid strobe crossing edge. Typically, the STOP signal is provided by the data source.

Additionally, in alternate embodiments, sense amplifiers 114 and 116 along with the squelching arrangement may be disabled (as opposed to having their outputs ignored) when input section 10 is configured to operate in the single-ended signaling mode, and sense amplifiers 118 and 120 may be disabled (as opposed to having their outputs ignored) when input section 10 is configured to operate in the differential signaling mode.

Figure 3:
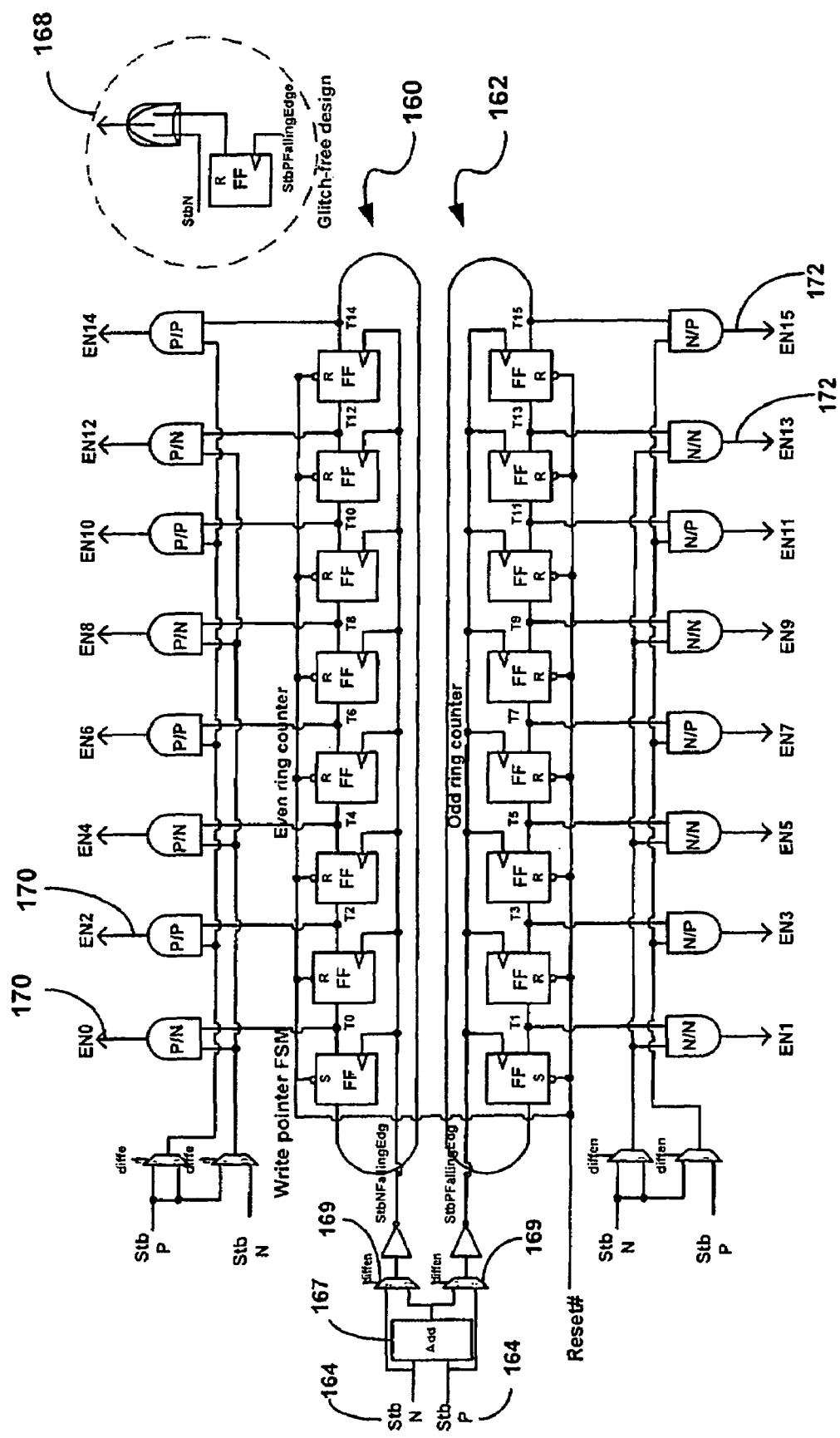
FIG. 3 illustrates the configurable enabling pulse clock generator of FIG. 1 in further detail, according to some embodiments of the invention.

FIG. 3 illustrates enabling pulse clock generator 24 in further detail, according to some embodiments of the invention. Recall enabling pulse clock generator 24 is employed to provide enabling pulse clocks to latch banks 26 to control their data latching operations. Further, enabling pulse clock generator 24 is advantageously designed to be able to configurably provide the enabling pulse clocks for a selected one of a differential signaling and a single-ended signaling mode of operation. More specifically, for the embodiments of FIGS. 1, 2A and 2B, enabling pulse clock generator 24 may be advantageously designed to be able to configurably provide a set of 16 enabling pulse clocks En-En15 in 16 points in time in a period, one enabling pulse clock per point in time for differential signaling, and in 8 points in time in a period, two enabling pulse clocks per point in time for single-ended signaling.

For the embodiment of FIG. 3, enabling pulse clock generator 24 includes add unit 167, selectors 169, ring counters 160 and 162, and two sets of logic elements 170 and 172, coupled to each other as shown.

Ring counters 160 and 162 are employed to generate the enabling pulse clocks. More specifically, ring counters 160 and 162 are designed to generate the enabling pulse clocks based on the StbNFallingEdge and StbPFallingEdge signals. For the embodiment, each of ring counters 160 and 162 includes 8 stages. Thus, if StbNFallingEdge and StbPFallingEdge are identical signals, each of ring counters 160 and 162 outputs 8 enabling pulse clocks (En0, En2, . . . En14, or En1, En3, . . . En15) in 8 points in time during the period (for a corresponding even/odd bank of latch banks 26). However, if StbNFallingEdge and StbPFallingEdge are two different signals (e.g. 180 degrees out of phase), each of ring counters 160 and 162 outputs 8 enabling pulse clocks (En0, En2, . . . En14, or En1, En3, . . . En15) in 16 points in time during the period (for a corresponding even/odd bank of latch banks 26). In various embodiments, ring counters 160 and 162 may be implemented as Johnson counters.

Add unit 167 may be employed to generate the identical version of StbNFallingEdge and StbPFallingEdge based on the Stb N and Stb P signals 164.

Selectors 169 are employed to output a selected one of the StbN and the identical version, and a selected one the StbP and the identical version for ring counters 160 and 162 respectively, depending on the signaling mode (as denoted e.g. by the Diffen signal). More specifically, selectors 169 are employed to output the StbN and StbP signals as StbNFallingEdge and StbPFallingEdge for ring counters 160 and 162 respectively, when configured to operate in the differential signaling mode, and two streams of the identical version as StbNFallingEdge and StbPFallingEdge for ring counters 160 and 162 respectively, when configured to operate in the single-end signaling mode. In the single-end signaling mode, add unit 167 may be employed to generate the two identical streams of StbNF allingEdge and StbP-FallingEdge based on the Stb N and Stb P signals 164.

The two sets of AND gates 170 and 172 are employed to ensure the falling edge of each En signal is caused by the appropriate strobe signal. More specifically, for the embodiment, half of the set of AND gates 170 receives the StbP signal as one of the inputs, regardless of the signaling mode, whereas the other half receives the StbP signal as one of the inputs when generator 24 is configured to operate in the differential signaling mode, and the StbN signal as one of the inputs when generator 24 is configured to operate in the single-ended signaling mode. Complementarily, for the other set of AND gates 172, half receives the StbN signal as one of the inputs, regardless of the signaling mode, whereas the other half receives the StbN signal as one of the inputs when generator 24 is configured to operate in the differential signaling mode, and the StbP signal as one of the inputs when generator 24 is configured to operate in the single-ended signaling mode.

Further, for the embodiment, to facilitate improved operation in the single-ended signaling mode, a glitch design may be included for each output of each stage of ring counters 160 and 162.

Figure 4:
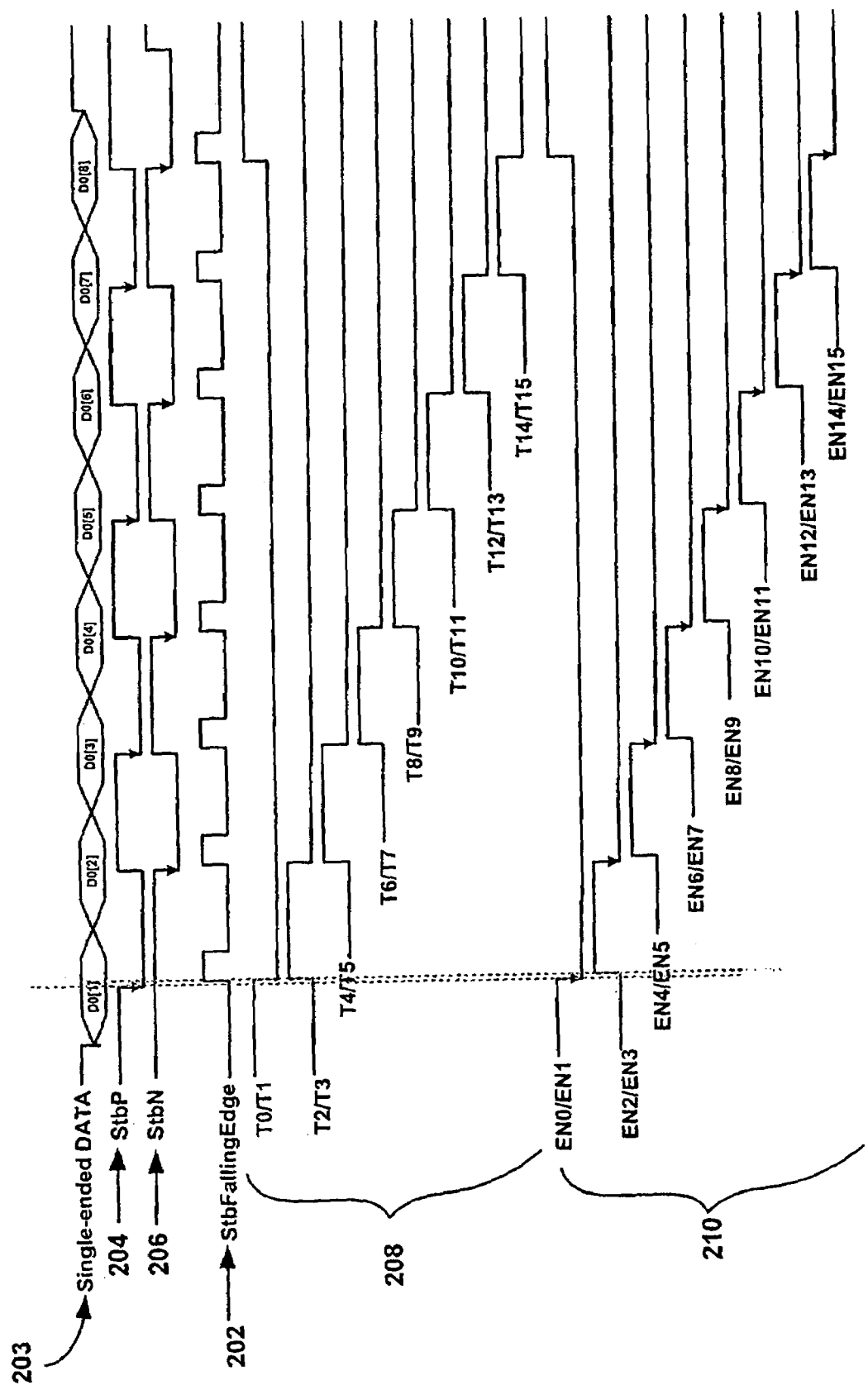
FIG. 4 illustrates timing diagrams for various signals when configured to operate in the single-ended signaling mode, according to some embodiments of the invention.

FIG. 4 depicts the timing of the various signals when enabling pulse clock generator 24 is configured to operate in the single-ended signaling mode according to some embodiments. For the illustrated embodiment, each of these timing diagrams 203, 204, 206, 208 and 210 represents a period of two bus clock cycles. In this example, 8 data bits 203 are to be latched and transferred during the period. When configured to operate in the single-ended signaling mode, StbFallingEdge pulses 202 may be formed based on the falling edges of StbP 204 and StbN 206 as shown. StbFallingEdge pulses 202 (the identical version of StbNFallingEdge and StbPFallingEdge) may then be fed into ring counters 160 and 162 to generate initial enabling pulses 208 (T0 T2 . . . T14 and T1 T3 . . . T15). These pulses when "AND'd" with the appropriate strobes result in clock pulses 210 (En0 En2 . . . En14 and En1 En3 . . . En15) at the 8 points in time during the period.

Figure 5:
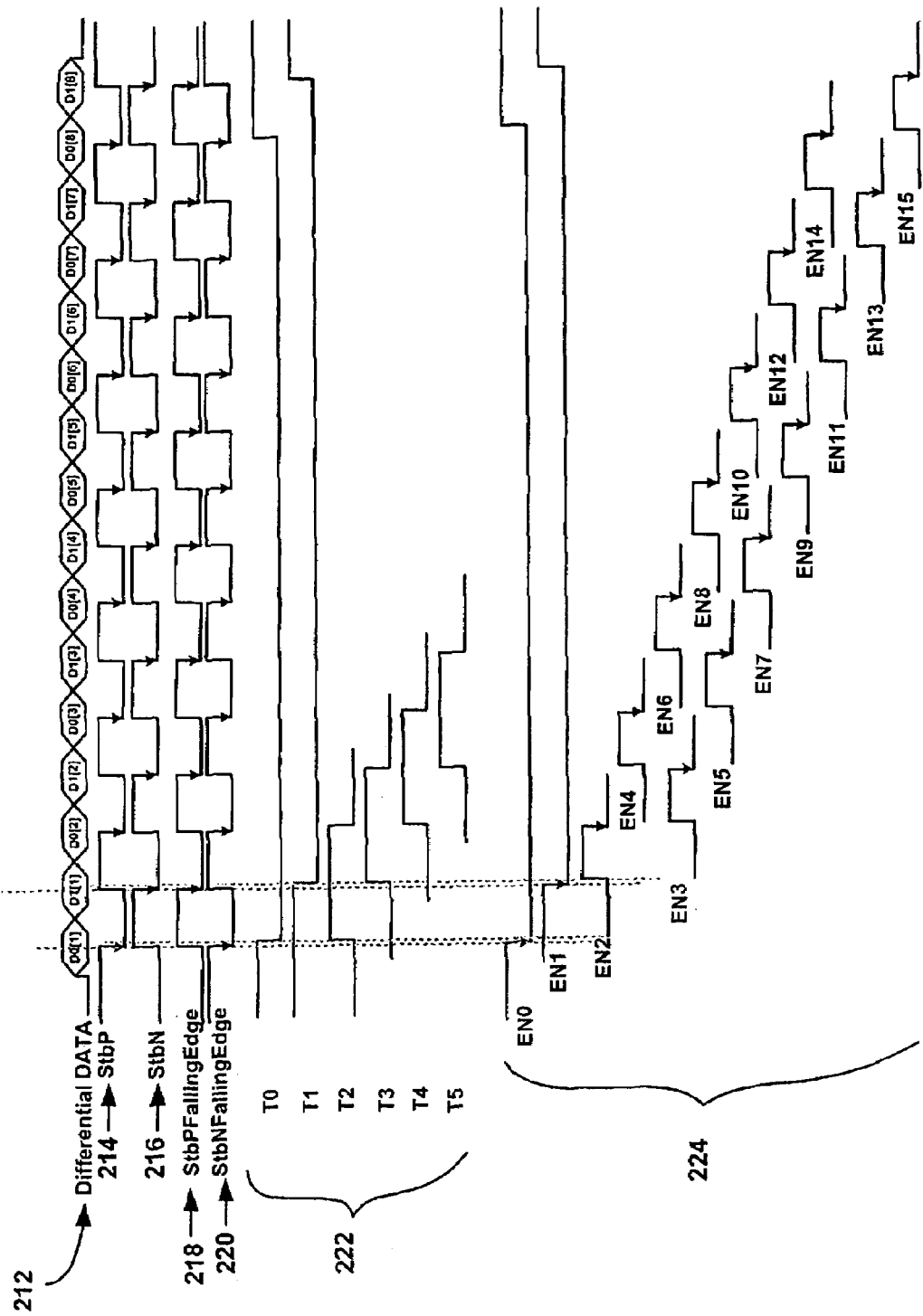
FIG. 5 illustrates timing diagrams for various signals when configured to operate in the differential signaling mode, according to some embodiments of the invention.

FIG. 5 depicts timing of the various signals when enabling pulse clock generator 24 is configured to operate in the differential signaling mode according to some embodiments. Similarly, for the illustrated embodiment, each of these timing diagrams 212, 218, 220, 222 and 224 represents a period of two bus clock cycles. In this example, two sets of 8 data bits 212 are to be interleavingly latched and transferred on during the period. When configured to operate in the differential signaling mode, StbPFallingEdge and StbNFallingEdge pulses 218 and 220 may be formed based on StbP 204 and StbN 206 as shown. StbNFallingEdge and StbPFallingEdge pulses 218 and 220 may then be fed into ring counters 160 and 162 to generate initial enabling pulses 222 (T0 T2 . . . T14 and T1 T3 . . . T15). These pulses when "AND'd" with the appropriate strobes result in clock pulses 224 (En0 En2 . . . En14 and En1 En3 . . . En15) at the 16 points in time during the period.

Figure 6A:
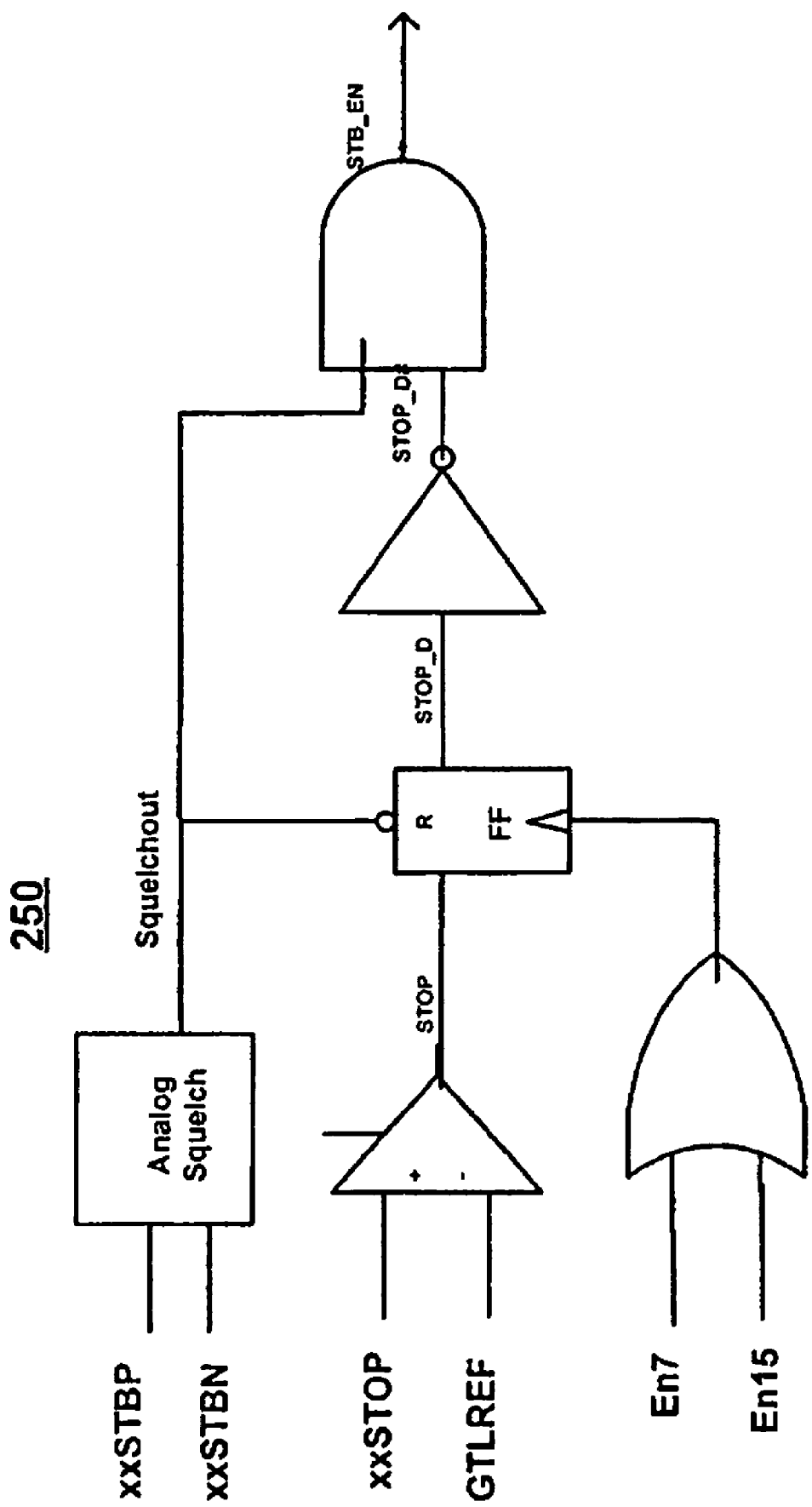
FIGS. 6A and 6B illustrate the squelch circuitry of FIG. 2A in further detail, and an associated timing diagram, according to some embodiments of the invention.
Figure 6B:
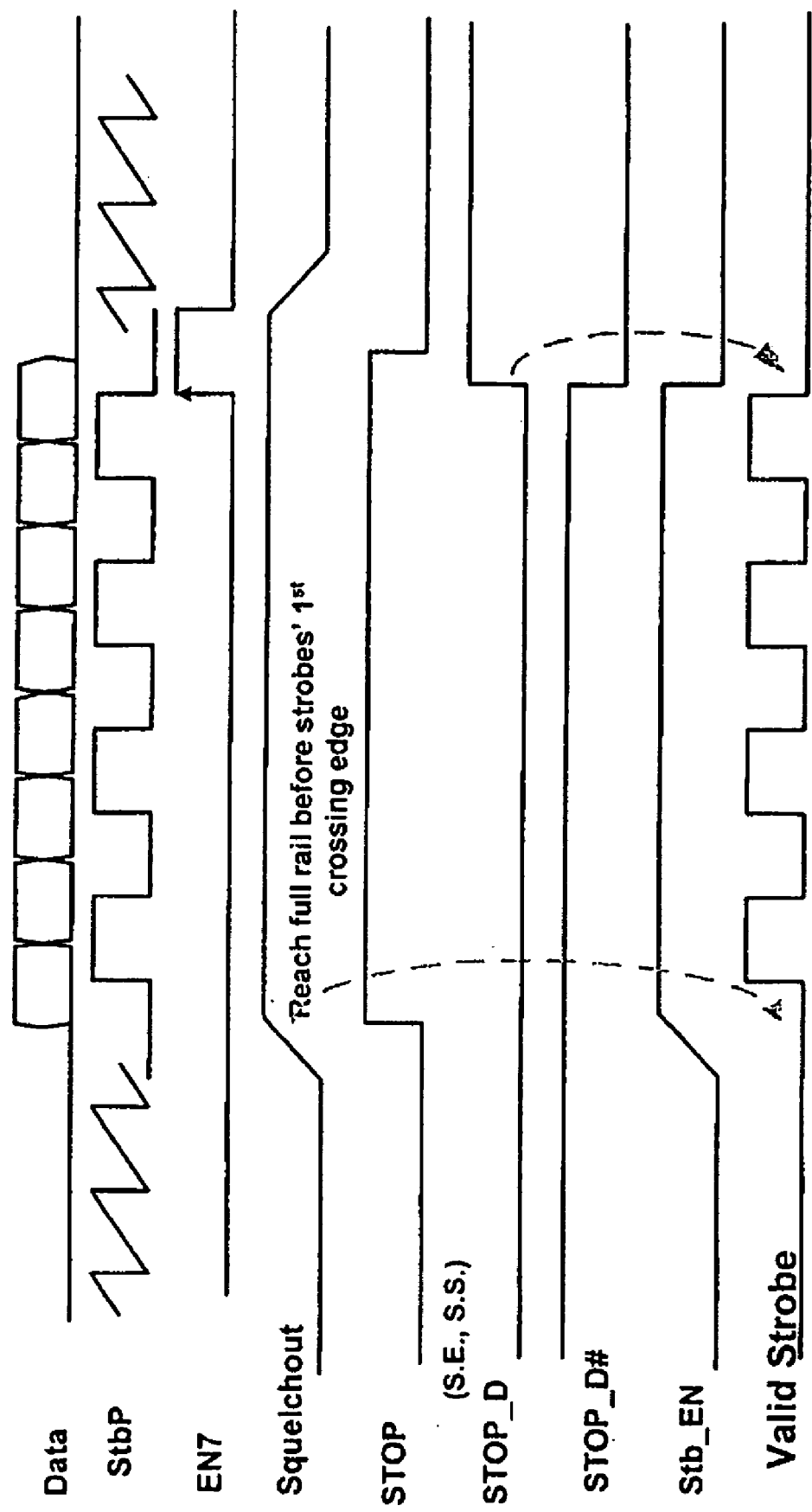

Referring now briefly back to FIG. 2A, recall that during the differential signaling mode of operation, strobes may not always be fully differential. A pair of strobes may be "parked" at low. Accordingly, a squelching arrangement may be employed to ensure only valid strobe signals (and not random noises) are outputted as StbN and StbP signals. FIGS. 6A and 6B depict one such arrangement in further detail, and timing of various signals, according to some embodiments of the invention.

Circuit 250 depicted in FIG. 6a is an analog squelch circuit. It employs the earlier described source synchronous STOP signal (provided by the data source) to detect the last valid crossing edge of the strobes. The embodiment also allows the data burst to be either 8 or 16. Accordingly, En7 and En15 are also sampled to determine whether the data source is sending the last chunk of data. If so, STOP_D shown in FIG. 6B may rise and close the stb_EN signal window. Stb_EN may then be ANDed with StbP/StbN to filter out false edges.

Figure 7:
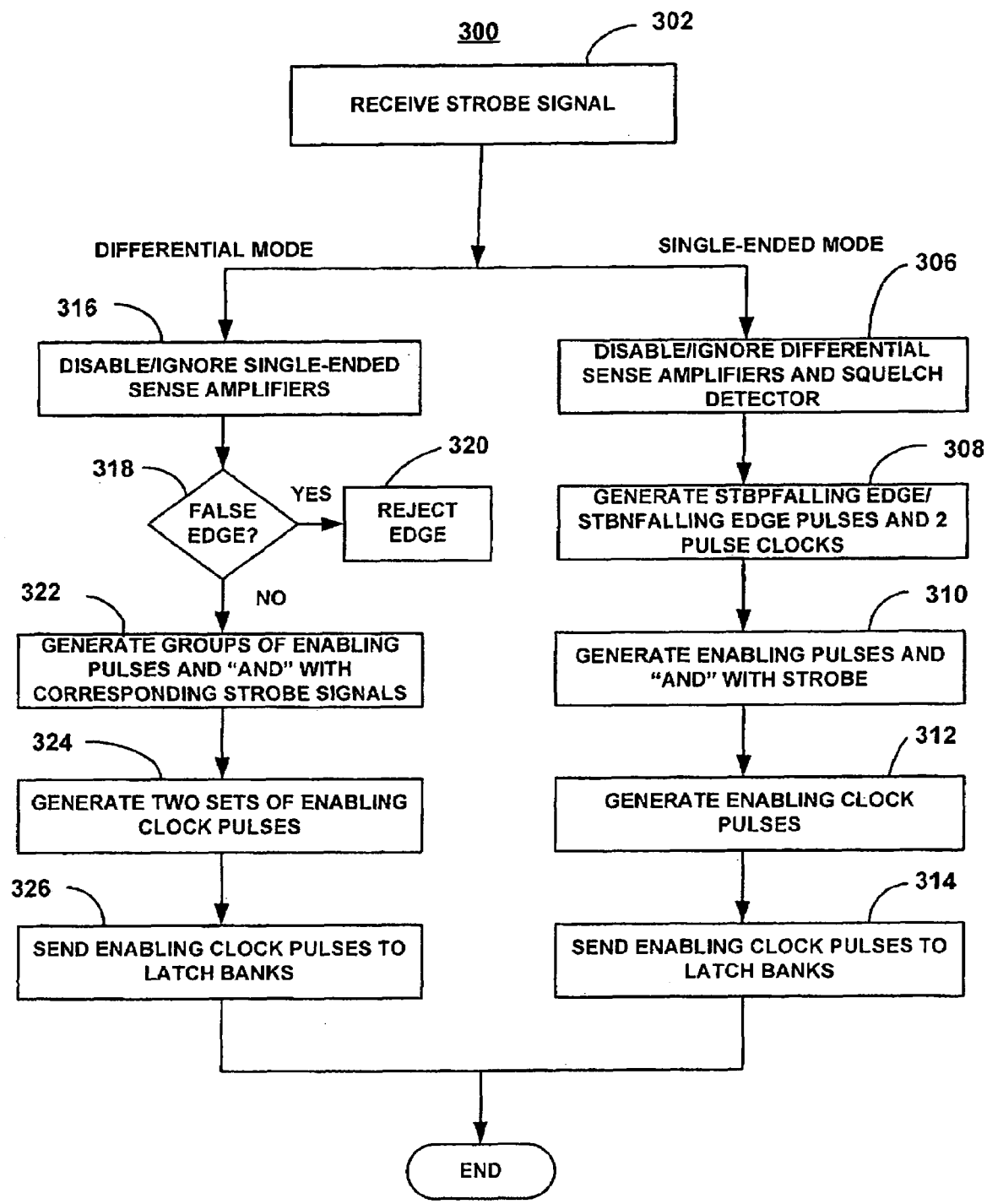
FIG. 7 is a flow diagram of a process for configurably generating enabling pulse clocks for different signaling modes, according to some embodiments of the invention.

FIG. 7 is a flow diagram 300 that illustrate a method of the invention, according to some embodiments of the invention. At 302, strobe signals are received from, for example, an external source. If the input section 10 is configured to operate in single-ended signaling mode, then differential sense amplifiers and squelch detector may be disabled or their outputs may be ignored at 306. Based on the strobe signals received, StbPFallingEdge/StbNFallingEdge pulses may be generated from the falling edges of StbP and StbN at 308. Each of the pulse clocks may then be fed into a ring counter to generate initial enabling pulse clocks at 310 (for an 8-bit embodiment, each ring counter may generate 16 enabling pulses in 8 points in time in a period). These enabling pulses may then be "AND'd" with strobes to generate the final enabling pulse clocks at 312. These enabling pulse clocks may then be sent to the latch banks at 314.

If input section 10 is configured to operate in the differential signaling mode, then single-ended sense amplifiers may be disabled or their outputs may be ignored at 316. A determination may be made at 318 as to whether the edges of the strobes received in the received clock signals are false edges. If so, the edge or edges may be rejected at 320

The process continues until the true edge or edges are found. Once a true strobe edge or edges are found, two groups of initial enabling pulses may be generated from even and odd ring counters at 322 (for an 8-bit interleaved embodiment, each ring counter may generate 16 enabling pulses in 16 points in time in a period). Each group may be ANDed with its corresponding strobe signals. Based on the generated enabling pulses, two sets of enabling clock pulses may be generated such that the falling edges of these pulses may be determined by the corresponding strobes at 324. The enabling clock pulses are then sent to latch banks at 326.

Figure 8:
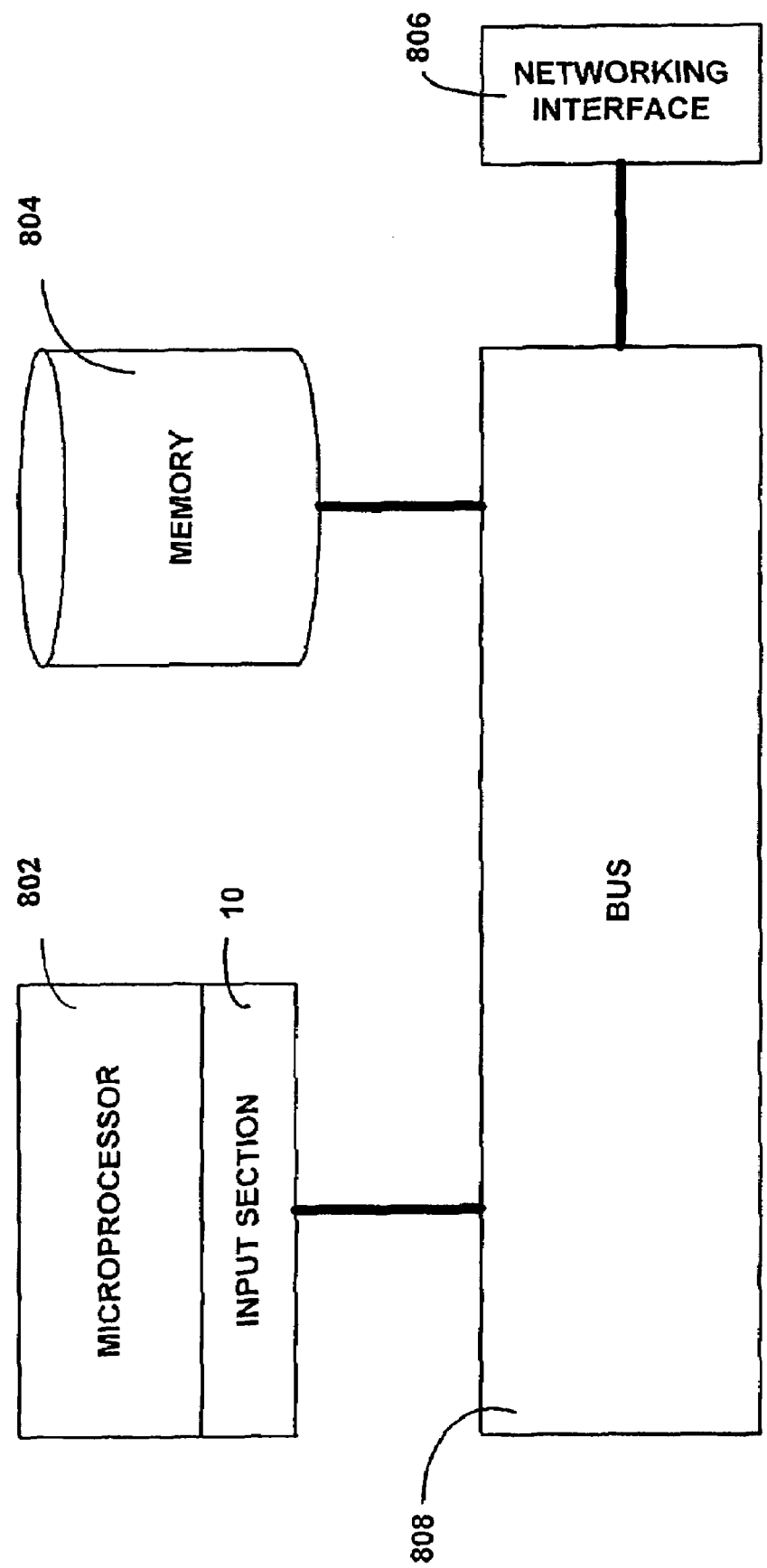
FIG. 8 is a block diagram of an example system, according to some embodiments of the invention.

FIG. 8 illustrates a system 800 in accordance with one embodiment. As illustrated, for the embodiment, system 800 includes microprocessor 802, memory 804, and networking interface 806 coupled to each other, via bus 808. For the embodiment, microprocessor 802 is advantageously equipped with input section 10 of FIG. 1. Further, it forms a portion of the interface between microprocessor 802 and bus 808. Accordingly, microprocessor 802 may be configured to accept data input under at least a differential signaling mode and a single-ended signaling mode.

Beside the advantageous incorporation of input section 10, microprocessor 802, memory 804, networking interface 806 and bus 808 all represent corresponding broad ranges of these elements known in the art or to be designed.

Depending on the applications, system 800 may include other components, including but are not limited to non-volatile memory, chipsets, mass storage (such as hard disk, compact disk (CD), digital versatile disk (DVD) and so forth), graphical or mathematic co-processors, and so forth. One or more of these components may also include input section 10.

In various embodiments, system 800 may be a personal digital assistant (PDA), a wireless mobile phone, a tablet computing device, a laptop computing device, a desktop computing device, a set-top box, an entertainment control unit, a digital camera, a digital video recorder, a CD player, a DVD player, or other digital device of the like.

Although specific embodiments have been illustrated and described herein, it will be appreciated by those of ordinary skill in the art that a wide variety of alternate and/or equivalent implementations calculated to achieve the same purposes may be substituted for the specific embodiments shown and described without departing from the scope of the present invention. This application is intended to cover any adaptations or variations of the embodiments discussed herein. Therefore, it is manifestly intended that this invention be limited only by the claims and the equivalents thereof.

What is claimed is:

1. An apparatus comprising:
   a first and a second input to receive a first and a second strobe signal respectively;
   a combiner coupled to the first and second inputs to generate a third strobe signal based at least in part on the first and second strobe signals; and
   a first and a second configurable ring counter arrangement configurably coupled to a selected one of the first input and the combiner, and a selected one of the second input and the combiner respectively, to output a plurality of enabling pulse clocks based on the selected one of the first and second strobe signals, and the third strobe signal.

2. The apparatus of claim 1, wherein each of the first and second configurable ring counter arrangements includes a ring counter of n stages, to facilitate the first and second configurable ring counter arrangement to jointly output $2n$ enabling pulse clocks in a selected one of $2n$ points in time during a period based on the first and second strobe signals, one enabling pulse clock for each point in time, and n points in time during the period based on the third strobe signal, two enabling pulse clocks for each point in time.

3. The apparatus of claim 1, wherein the first configurable ring counter arrangement includes a selector coupled to the first input and the combiner to configurably output a selected one of the first strobe signal and the third strobe signal.

4. The apparatus of claim 1, wherein the first configurable ring counter arrangement includes
   a ring counter of n stages having n outputs respectively; and
   a configurable set of n logic elements correspondingly coupled to the n stages of the ring counter to perform a logic operation on the n outputs of the ring counter, with at least half of the n logic elements configurably coupled to a selected one of the first and second inputs to enable the corresponding logic operations to be configurably performed based on a selected one of the first and the second strobe signal.

5. The apparatus of claim 4, wherein the logic elements comprise AND gates.

6. A method comprising:
   receiving a first and a second strobe signal;
   generating a third strobe signal based at least in part on the first and second strobe signals;
   selecting one of the first and the third strobe signal, and one of the second and the third strobe signal; and
   generating a plurality of enabling pulse clocks based on the selected one of the first and second strobe signals, and the third strobe signal.

7. The method of claim 6, wherein the method further comprises configuring for a selected one of a differential signaling mode and a single-ended signaling mode of operation.

8. The method of claim 7, wherein said selecting comprises selecting the first and second strobe signals when said configuring comprises configuring for the differential signaling mode of operation, and selecting the third strobe signal twice when said configuring comprises configuring for the single-ended signaling mode of operation.

9. The method of claim 7, wherein said generating the plurality of enabling pulse clocks comprises generating $2n$ enabling pulse clocks in a selected one of $2n$ points in time during a period based on the first and second strobe signals when said configuring comprises configuring for the differential signaling mode of operation, one enabling pulse clock for each point in time, and n points in time during the period based on the third strobe signal when said configuring comprises configuring for the single-ended signaling mode of operation, two enabling pulse clocks for each point in time.

10. The method of claim 6, wherein said generating the plurality of enabling pulse clocks comprises
    generating n outputs; and
    performing logic operations on at least half of the n outputs based on a configurably selected one of the first and the second strobe signal.

* * * * *